US007661859B2

(12) United States Patent  
Nakagawa

(10) Patent No.: US 7,661,859 B2
(45) Date of Patent: Feb. 16, 2010

(54) OPERATION PANEL

(75) Inventor: Kunihiro Nakagawa, Anjo (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 12/118,851

(22) Filed: May 12, 2008

(65) Prior Publication Data

US 2008/0285296 A1 Nov. 20, 2008

(30) Foreign Application Priority Data

May 16, 2007 (JP) ............................. 2007-130572

(51) Int. Cl.
*B60Q 1/00* (2006.01)
(52) U.S. Cl. ........................ 362/489; 362/23; 362/488; 362/482; 362/29
(58) Field of Classification Search .................. 362/23, 362/26–30, 459, 489, 488, 482, 89
See application file for complete search history.

(56) References Cited

U.S. PATENT DOCUMENTS

| 5,247,429 | A | * | 9/1993 | Iwase et al. ................... 362/29 |
| 6,338,561 | B1 | * | 1/2002 | Ikarashi ....................... 362/26 |
| 2002/0001183 | A1 | * | 1/2002 | Shigehiro ..................... 362/23 |
| 2006/0221592 | A1 | * | 10/2006 | Nada et al. .................... 362/29 |

FOREIGN PATENT DOCUMENTS

| JP | 63-065685 | 3/1988 |
| JP | 09-063393 | 3/1997 |
| JP | 2000-207977 | 7/2000 |
| JP | 2003-179266 | 6/2003 |
| JP | 2003-222537 | 8/2003 |
| JP | 2006-128054 | 5/2006 |
| JP | 2006-221044 | 8/2006 |

* cited by examiner

*Primary Examiner*—Anabel M Ton
(74) *Attorney, Agent, or Firm*—Nixon & Vanderhye P.C.

(57) ABSTRACT

An operation panel includes: a casing having a front surface; first and second operation elements disposed on the front surface of the casing; a light source for emitting light to each of the first and second operation elements and disposed in the casing; and a brightness adjustment layer for covering at least a part of a light emitting surface of the light source. The first operation element includes a first light transmission part, and the second operation element includes a second light transmission part. The light from the light source transmits the first and second light transmission parts so that the light is output from the casing. The brightness adjustment layer adjusts brightness of the light emitted from the light source and outputting toward one of the first and second light transmission parts.

13 Claims, 11 Drawing Sheets

OPERATION PANEL

CROSS REFERENCE TO RELATED APPLICATION

This application is based on Japanese Patent Application No. 2007-130572 filed on May 16, 2007, the disclosure of which is incorporated herein by reference.

FIELD OF THE INVENTION

The present invention relates to an operation panel.

BACKGROUND OF THE INVENTION

An operation panel for operating electronic equipment is mounted in a vehicle such as an automotive vehicle. For example, the operation panel is used for an air conditioning system, a car audio system or a navigation system. The operation panel is arranged on an operation unit in a compartment of the vehicle. The operation unit includes an operation part, which a passenger of the vehicle operates. The operation part is provided by a push operation type switch or a dial type switch. The operation part is disclosed in, for example, JP-A-H09-063393, JP-A-2006-128054 and JP-A-2000-207977. The operation part is a transmission illumination type operation part so that a passenger can recognize the operation part even at night. Specifically, a light transmission part is formed on a front surface of the operation part, and a light source for lighting up the operation part is arranged behind the light transmission part. The light source emits light to a front side of the operation part so that the light transmits the light transmission part from the light source. Here, in general, one light source corresponds to one operation part. The light source is formed of, for example, LED. In some cases, to reduce the number of the light sources, the light source is arranged at a boundary between two adjacent operation parts so that a light emitted from the light source is divided into two parts. Thus, only one light source can light up two adjacent operation parts. In this case, when the two adjacent operation parts are arranged such that a distance between one operation part and the light source is almost equal to a distance between the other operation part and the light source, illumination intensity of the operation parts is almost homogeneous. However, when the front surface of the operation panel has a certain shape, or when the operation part has a certain layout, the distance between one operation part and the light source is not equivalent to the distance between the other operation part and the light source. Thus, the illumination intensity of the operation parts is not uniform. Here, it is considered that a light source is individually mounted on each operation part, and a position of the source is individually adjusted so that a distance between the source and an operation part is uniform. Alternatively, it is considered that a driving voltage of a light source is individually adjusted in accordance with a distance between the source and an operation part. However, in these cases, it is necessary for the operation unit to include a number of light sources. Further, it is necessary to adjust each distance between the light source and the operation part individually, and/or to adjust each operation condition such as a driving voltage individually. Thus, a design and a manufacturing method are complicated.

SUMMARY OF THE INVENTION

In view of the above-described problem, it is an object of the present disclosure to provide an operation panel.

According to an aspect of the present disclosure, an operation panel includes: a casing having a front surface; first and second operation elements disposed on the front surface of the casing; a light source for emitting light to each of the first and second operation elements and disposed in the casing; and a brightness adjustment layer for covering at least a part of a light emitting surface of the light source. The first operation element includes a first light transmission part, and the second operation element includes a second light transmission part. The light from the light source transmits the first and second light transmission parts so that the light is output from the casing. The brightness adjustment layer adjusts brightness of the light emitted from the light source and outputting toward one of the first and second light transmission parts.

In the above panel, although the light source is commonly used for the first and second operation elements, the brightness adjustment layer equalizes the illumination intensity from the first and second operation elements.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

Figure 1:
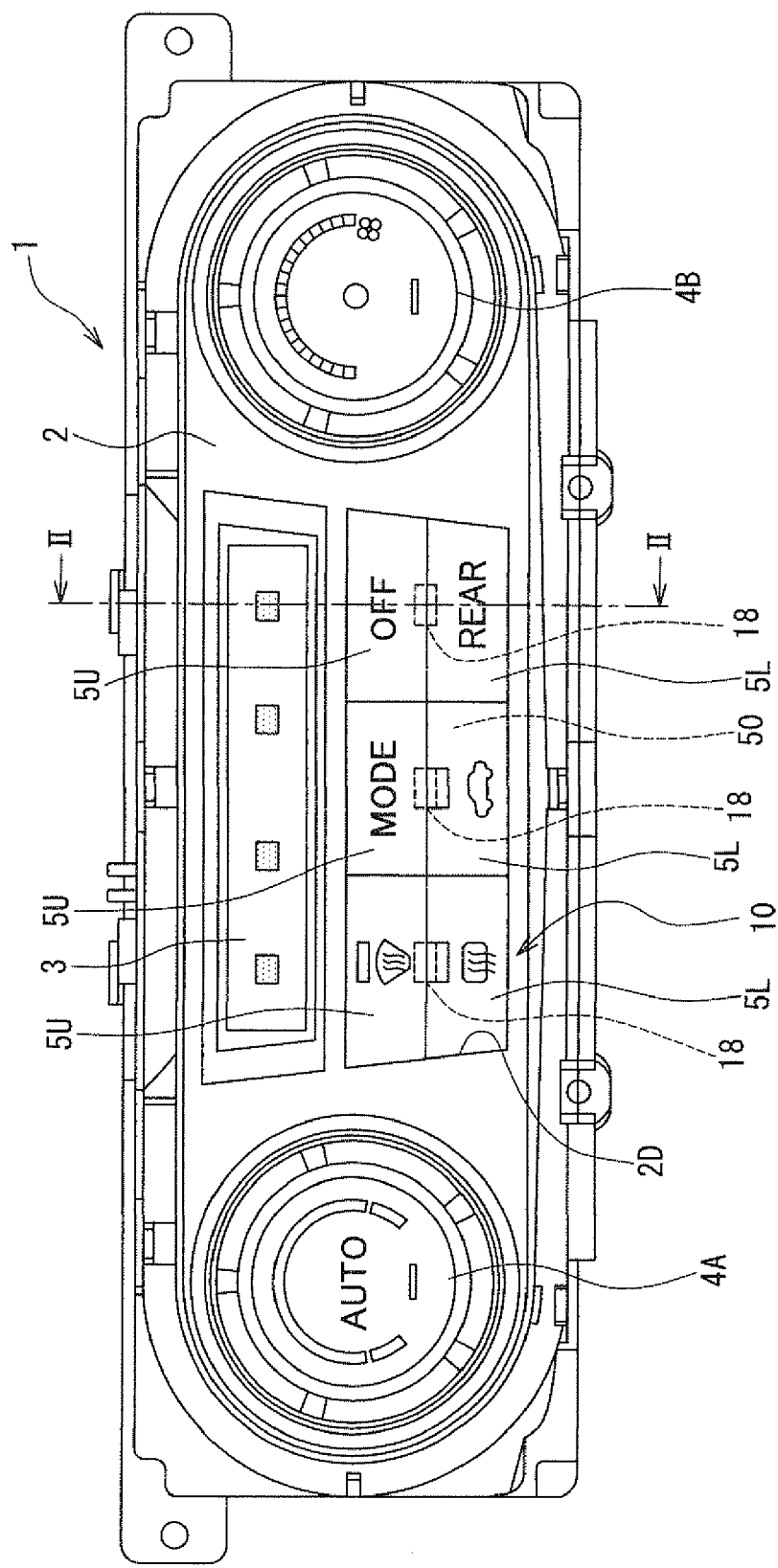
FIG. 1 is a front view showing an operation panel.

FIG. 1 shows an operation panel 1 according to an example embodiment. The panel 1 is used for operating, for example, in-vehicle electronic equipment such as vehicle air conditioning equipment. The panel 1 includes a casing 2 for providing a front surface of the panel 1, and the casing 2 is made of injection molded resin. Dial type operation parts 4A, 4B for controlling an air conditioning temperature and/or air volume are rotatably mounted on a front side of the casing 2. Push-button type operation parts 5U, 5L including a defroster switch, an air inlet/outlet mode selector switch, an air blow mode selector switch and the like are also mounted on the front side of the casing 2. A liquid crystal display 3 for displaying a preset temperature for an air conditioning system and the like is mounted on the front side of the casing 2. The push-button type operation parts 5U, 5L includes a light transmission part so as to recognize a position of the operation parts 5U, 5L even at night. The light transmission part is arranged on a front side. A light source 18 for lighting the operation parts 5U, 5L is arranged behind the light transmission part so that the light emitted from the light source 18 transmits the light transmission part. Thus, the operation part 5U, 5L is a transmission illumination type operation part.

Figure 2:
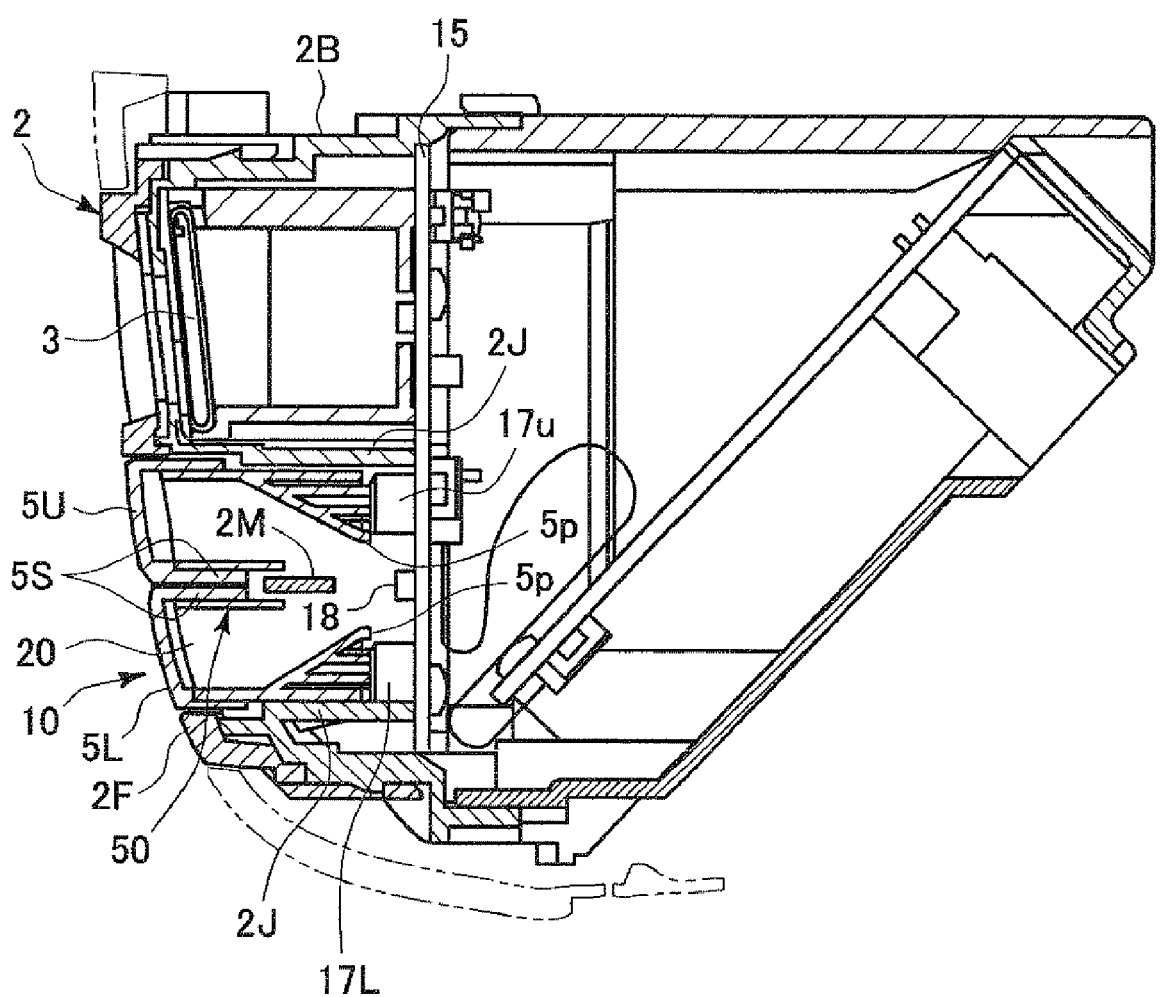
FIG. 2 is a side view showing the operation panel in FIG. 1.
Figure 3A:
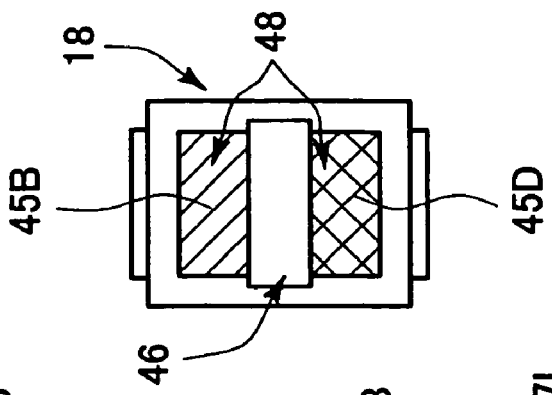
FIG. 3A is a partially enlarged side view showing the panel in FIG. 2.

FIGS. 2 and 3A show a side view of the operation panel 1. The light source 18 is disposed behind the operation parts 5U, 5L in the casing 2. The light source 18 is made of, for example, a light emitting diode such as a white light emitting diode. The operation parts 5U, 5L are mounted on the front side of the casing 2 such that a distance between the light source and the light transmission part of the upper push-button type operation part 5U is different from that of the lower push-button type operation part 5L. Specifically, as shown in FIG. 2, the front surface of the operation panel 1 is slant with respect to a traveling direction of a vehicle. Specifically, the front surface is slant in an up-down direction such that an upside of the panel 1 is arranged near an operator in the vehicle, and a downside of the panel 1 is arranged far from the operator. As shown in FIG. 1, the upper push-button type operation part 5U includes three upper push-button type operation elements, which are arranged in a right-left direction, and the lower push-button type operation part 5L includes three lower push-button type operation elements, which are also arranged in the right-left direction. Thus, the operation parts 5U, 5L are arranged in two rows, i.e., upper and lower rows. Three pairs of upper and lower push-button type operation elements are arranged in three rows, i.e., left, middle and right rows along with the right-left direction.

All of the operation parts 5U, 5L including the front wall 5F are made of light translucent material or light transmission material. The front wall 5F provides a light transmission part for transmitting the light from the light source 18. The light source 18 is arranged on a substrate 15, which is opposite to the front surface of the casing 2 so that the substrate 15 with the source 18 provides a back wall of the casing 2. Specifically, the source 18 is arranged at a position of the substrate 15, which corresponds to a boundary between the upper and lower push-button type operation parts 5U, 5L, which are adjacently arranged in the up-down direction. In this embodiment, multiple light sources 18 are arranged on the substrate 15 such that one of the sources 15 corresponds to one of three pairs of the upper and lower push-button type operation elements. Thus, three light sources 18 are disposed in the casing 2. Alternatively, only one light source 18 may be disposed on the substrate 15 such that the source 18 is disposed at a position of vertex set of the upper and lower push-button type operation parts 5U, 5L.

As shown in FIG. 3A, the front wall 5F of the upper push-button type operation part 5U is coupled with the front wall 5F of the lower push-button type operation part 5L at a boundary position 50 The front wall 5F of each operation part 5U, 5L provides a slanting surface, which is slant with respect to a vertical direction perpendicular to the boundary between the upper push-button type operation parts 5U, 5L. In this embodiment, with respect to the operator, the upper side of the operation panel 1 protrudes toward the operator, i.e., protrudes forward, and the lower side of the panel 1 concaves toward a direction opposite to the operator, i.e., concaves backward. A sidewall 5S protrudes backward along with a backside periphery portion of the front wall 5F. The sidewall 5S and the front wall 5F are integrally formed. A guide wall 2J and a separation wall 2M are integrated in the casing 2 so that the guide wall 2J and the separation wall 2M are perpendicular to the substrate 15. An upper sidewall of the upper push-button type operation part 5U and a lower sidewall of the lower push-button type operation part 5L are guided along with the front-back direction by the guide wall 2J when he upper and/or lower push-button type operation parts 5U, 5L are pushed by the operator. The separation wall 2M is disposed at the boundary position 50 between the upper and lower push-button type operation parts 5U, 5L. Movement of a lower sidewall of the upper push-button type operation part 5U and an upper sidewall of the lower push-button type operation part 5L is limited with the separation wall 2M. Specifically, an end of the of each of the lower sidewall of the upper push-button type operation part 5U and an upper sidewall of the lower push-button type operation part 5L is limited by the separation wall 2M so that a maximum pushing position of the end is restricted.

An upper switch 17U and a lower switch 15L are arranged over and under the light source 18, and they are disposed on the substrate 15. The upper push-button type operation part 5U pressurizes the upper switch 17U, and the lower push-button type operation part 5L pressurizes the lower switch 17L. A pushing member 5P made of resin is inserted to the inside of the sidewall 5S, which is rounded in a circumferential direction along with an outer periphery of the front wall 5F, so that the pushing member 5P pressurizes the switch 17U, 17L. A light guide LG is formed on a side of the pushing member 5P, which is near the light source 18. Specifically, the side of the pushing member 5P is obliquely cut along with a light emission path L1, L2 of the light emitted from the source 18. The light proceeds toward a direction viewing the front wall 5F from the source 18 with diffusing in the up-down direction.

A slanting design of the front surface of the panel 1 provides that the distance between the front wall 5F of the upper push-button type operation part 5U and the light source 18 differs from the distance between the front wall 5F of the lower push-button type operation part 5L and the light source 18. Here, the light source 18 is commonly used for the upper and lower push-button type operation parts 5U, 5L, which are adjacently arranged along with the slanting direction. When the brightness of the light source 18 is constant, the illuminance on a plane that is illuminated by the light source 18 becomes smaller in inverse proportion to the square of the distance from the light source to the plane.

Figure 3B:
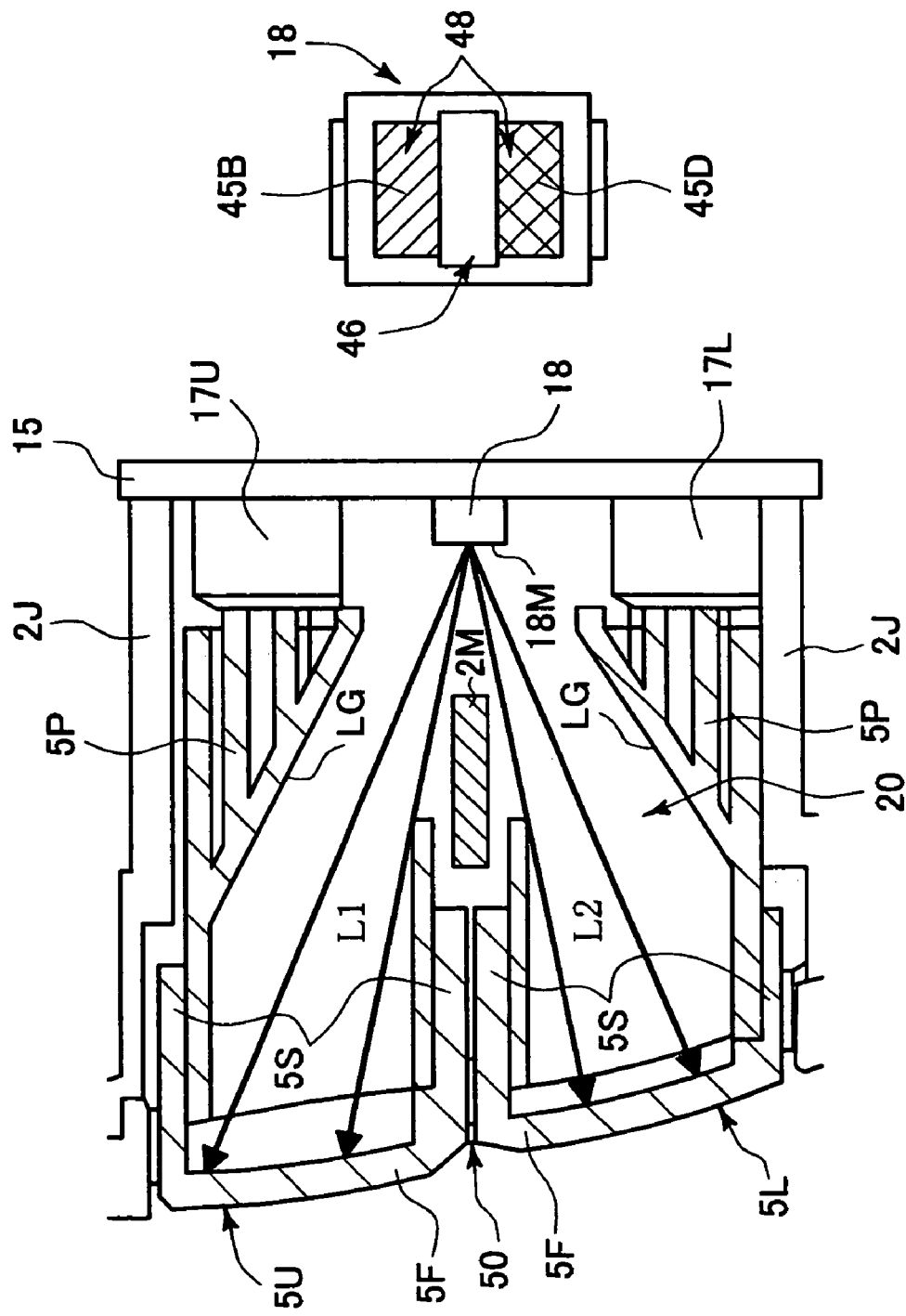
FIG. 3B is a partially enlarged front view showing the panel in FIG. 2.

A light emitting surface 18M of the light source 18 is shown in FIG. 3B. The light emitting surface 18M includes an upper region 45B and a lower region 45D. The upper region 45B corresponds to the front wall 5F of the upper push-button type operation part 5U, and the lower region 45D corresponds to the front wall 5F of the lower push-button type operation part 5L. Both of the upper and lower regions 45B, 45D are covered with a light extinction adjustment layer 48 (i.e., light reduction adjustment layer), which adjusts a difference of the illumination intensity between the upper and lower push-button type operation parts 5U, 5L. Thus, the light reduction adjustment layer 48 provides a brightness adjustment layer. The difference of illumination intensity corresponds to a difference between first and second distances, the first distance between the lower region 45D and the front wall 5F of the lower push-button type operation part 5L, and the second distance between the upper region 45B and the front wall 5F of the upper push-button type operation part 5U.

Figure 4A:
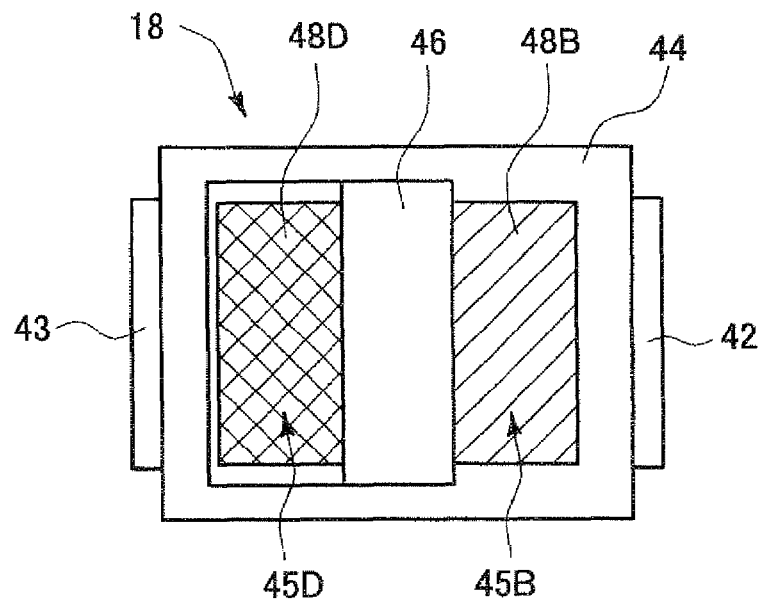
FIG. 4A is an enlarged plan view showing a light source.
Figure 4B:
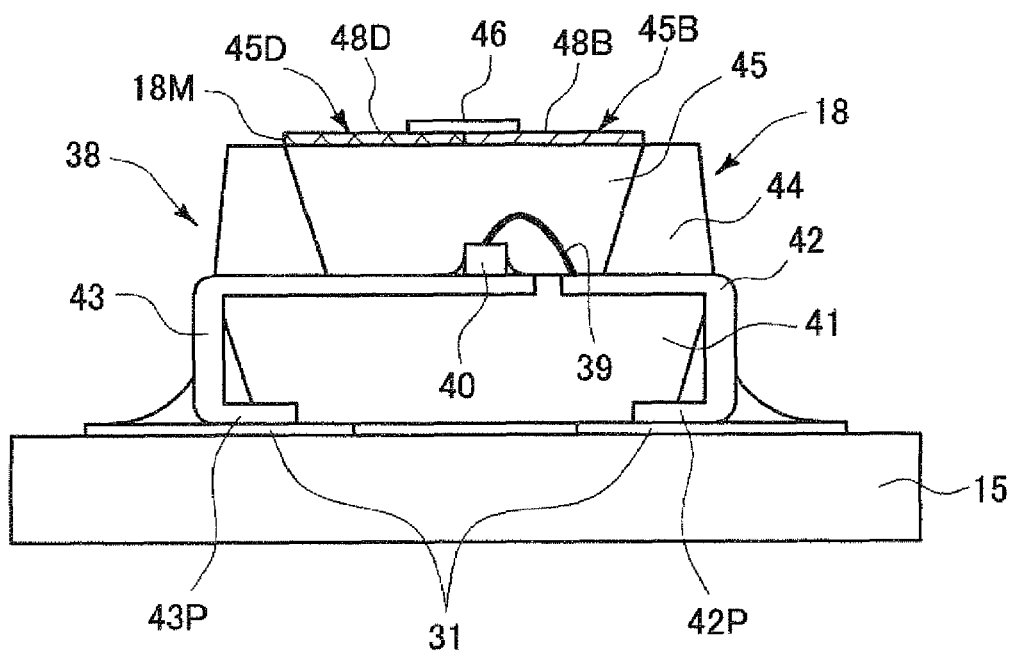
FIG. 4B is a side view showing the light source.

As shown in FIGS. 4A and 4B, the light source 18 includes a light emitting element 40 and a resin mold 45. The light emitting element 40 is sealed with the resin mold 45, which is made of epoxy resin or the like, so that the resin mold 45 has light translucent property or light transparent property. The light source 18 provides a light emitting module. The surface of the resin mold 45 provides the light emitting surface 18M. Specifically, the light emitting module includes a case 38 and the light emitting element 40. The case 38 has a concavity 45C for arranging the element 40. The light emitting element 40 is disposed on a bottom of the concavity 45C. The resin mold 45 fills the concavity 45C. The light emitting surface 18M is formed on an opening side of the concavity 45C in such a manner that the surface 18M is flat.

The case 18 further includes a base 41 and a frame 44. The base 41 made of resin provides the bottom of the concavity 45C. The frame 44 is integrated with the base 41. The frame 44 provides an inner wall of the concavity 45C. The base 41 has a first principal surface, on which a first lead 43 and a second lead 42 is disposed. The first and second leads 43, 42 are insulated from each other. The first lead 43 is coupled with a backside electrode of the light emitting element 40, and the second lead 42 is coupled with a front side electrode of the light emitting element 40 through a bonding wire 39. The front side electrode is disposed on a light emitting surface of the element 40. The first lead 43 includes one end portion, on which the element 40 is connected, and the other end portion, which provides a conductive pad 43P. The first lead 43 is bent along with the sidewall of the base 41 and further bent on a second principal surface of the base 41. The second principal surface is opposite to the first principal surface so that the second principal surface provides a backside of the base 41. The conductive pad 43P is used for surface mounting. The second lead 42 includes one end portion, on which the element 40 is connected, and the other end portion, which provides a conductive pad 42P. The second lead 42 is bent along with the sidewall of the base 41 and further bent on the second principal surface of the base 41. The conductive pad 42P is used for surface mounting. The frame 44 made of resin is integrated with the base 41 such that the frame 44 is bonded to the first principal surface. The frame 44 and the base 41 sandwich the first and second leads 43, 42.

The light extinction adjustment layer 48 includes a resin layer having pigment or dye component, which has light blocking property or light absorption property. For example, the resin layer is made of a coated film layer with a vehicle made of ultraviolet cure resin. In this case, after a print layer is formed, ultraviolet light is irradiated on the print layer so that the print layer is hardened. Specifically, a print resin layer is formed on the light emitting surface 18M, which is provided by the resin mold 45. The print resin layer is formed by an ink jet method, which is disclosed in, for example, JP-A-2006-128054 and JP-A-2000-207977. In this case, an ink made of a coating component for forming the light extinction adjustment layer 48 is used. Light reduction rate of each part of the light extinction adjustment layer 48 is adjusted by concentration of print. A concentration pattern for defining the light reduction rate is adjustable with a concentration of a pixel composing the pattern by controlling density of ink droplet, which is sprayed.

The light extinction adjustment layer 48 includes an upper portion 48B and a lower portion 48D. The upper portion 48B covers the upper region 45B, and the lower portion 48D covers the lower region 45D. The distance between the front wall 5F as the light transmission part and the upper region 45B is different from the distance between the front wall 5F and the lower region 45D. The light reduction rate of the light extinction adjustment layer 48 becomes larger as the distance between the light transmission part and the adjustment layer 48 becomes smaller. Specifically, the lower portion 48D as a first portion corresponds to the front wall 5F as the light transmission part of the upper push-button type operation part 5L, which is disposed near the light emitting surface 18M. Here, the light transmission part provides a push operation surface. The upper portion 48B as a second portion corresponds to the front wall 5F of the upper push-button type operation part 5U, which is disposed far from the light emitting surface 18M. The light reduction rate of the first portion 48D is larger than the second portion 48B.

The light extinction adjustment layer 48 reduces the difference of illumination intensity between the front wall 5F of the upper push-button type operation part 5U and the front wall 5F of the lower push-button type operation part 5L. The difference of illumination intensity corresponds to the difference between the first and second distances, the first distance between the light source 18 and the front wall 5F of the lower push-button type operation part 5L, and the second distance between the light source 18 and the front wall 5F of the upper push-button type operation part 5U. The light extinction adjustment layer 48 is formed on the light emitting surface 18M of the light source 18 so that the illumination intensity from the front wall 5F of the operation panel 1 is homogenized even when the light source 18 is commonly used for both of the upper and lower push-button type operation parts 5U, 5L, which have different distances from the light source 18 and the front wall 5F. Further, the operation panel 1 has a simple structure with the light extinction adjustment layer 48.

Figure 3C:
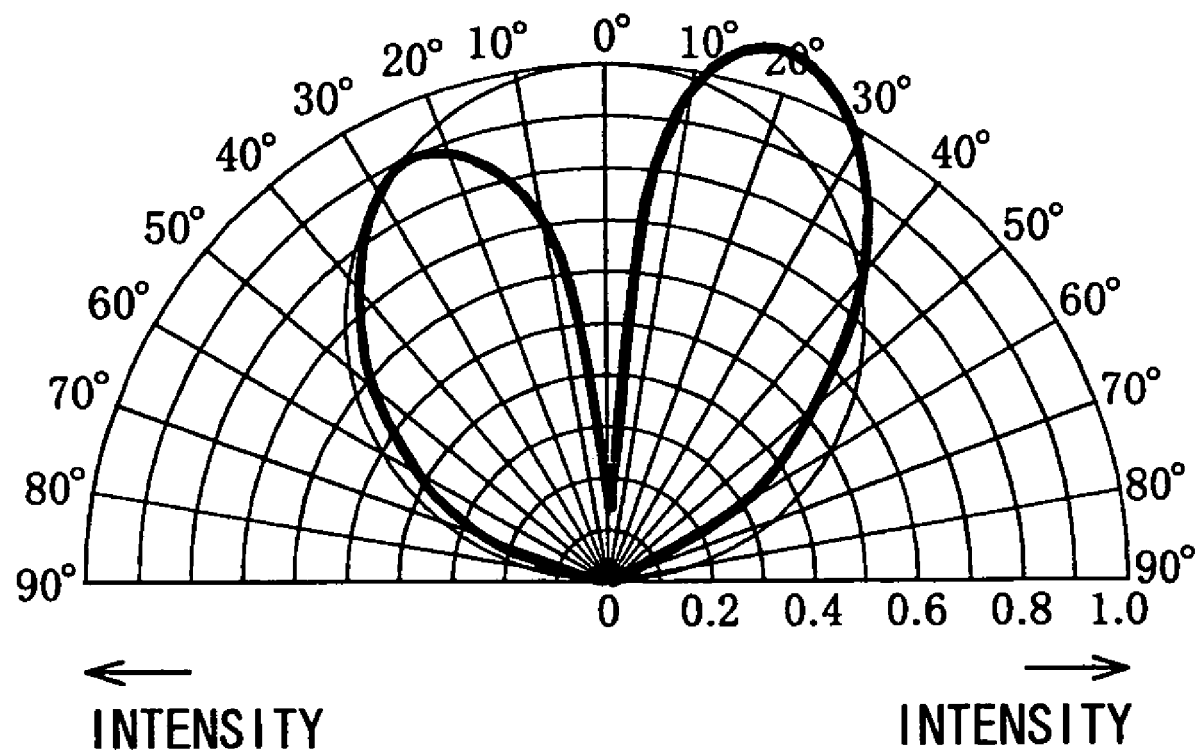
FIG. 3C is a graph showing a distribution of emission intensity.
Figure 5A:
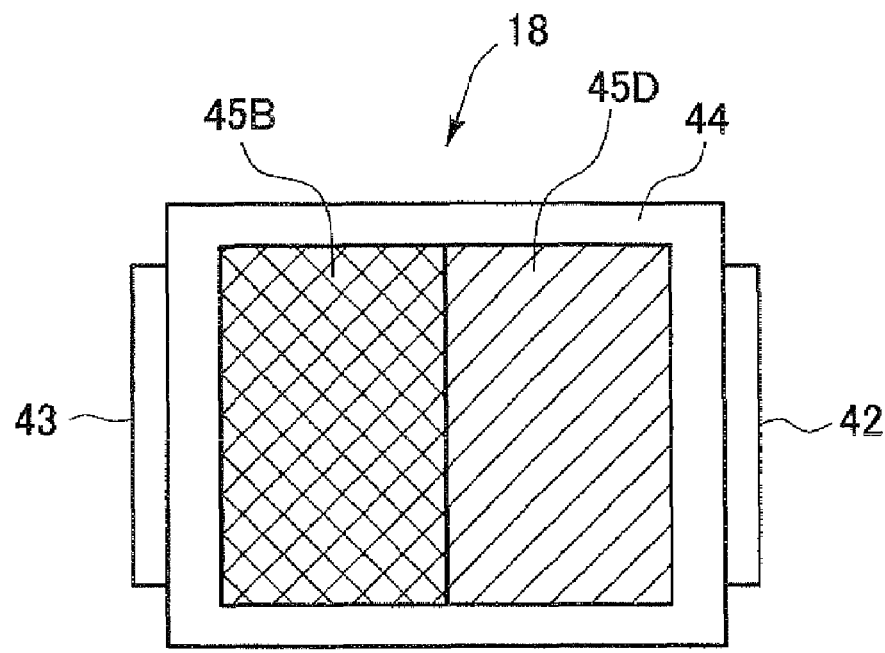
FIG. 5A is an enlarged plan view showing a light source.
Figure 5B:
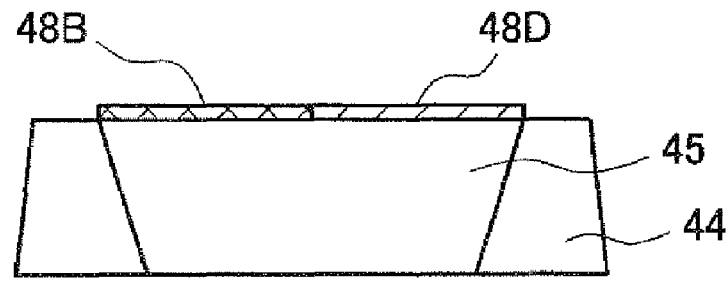
FIG. 5B is a side view showing the light source, according to a first modification.

Further, to improve visual quality of the panel 1, a light shield layer 46 is arranged on the light source 18. The light shield layer 46 is disposed on the light emitting surface 18M of the light source 18, as shown in FIG. 3B. The light shield layer 46 covers a region corresponding to the boundary between the upper and lower push-button type operation parts 5U, 5L so that the light from the light source 18 does not leak from the boundary. The light extinction adjustment layer 48 is formed from one body of a print layer so that the light extinction adjustment layer 48 continuously covers the first and second regions 45D, 45B in a plane parallel to the light emitting surface 18M. The light shield layer 46 is formed from a white overprinting layer, and has a stripe shape lying astride the boundary between the first and second regions 45D, 45B. FIG. 3C shows an intensity distribution of emitting light from the light emitting surface 18M toward the upper and lower push-button type operation parts 5U, 5L. In FIG. 3C, the intensity distribution is shown in the up-down direction with a normal line as a reference line (i.e., a zero degree line), which passes through a center of the light emitting surface 18M. The illumination light from the light source 18 near the boundary position 50 is reduced or shielded by the light shield layer 46, so that the intensity around the zero degree line becomes small. In an upper region disposed over the light shield layer 46 and corresponding to the upper push-button type operation part 5U, the reduction rate of light by using the light extinction adjustment layer 48 is comparatively small, so that the intensity is large. In a lower region disposed under the light shield layer 46 and corresponding to the lower push-button type operation part 5L, the reduction rate of light by using the light extinction adjustment layer 48 is comparatively large, so that the intensity is small. Thus, the light having the large intensity is emitted from the light source 18 toward the upper push-button type operation part 5U, which is disposed far from the light source 18, and the light having the small intensity is emitted from the light source 18 toward the lower push-button type operation part 5L, which is disposed near the light source 18. The light extinction adjustment layer 48 provides a directional distribution of the light intensity having unevenness in the up-down direction. The light source 18 may have no light shield layer 46, if it is not necessary to prevent light leakage from the boundary between the upper and lower push-button type operation parts 5U, 5L, as shown in FIGS. 5A and 5B.

Figure 6:
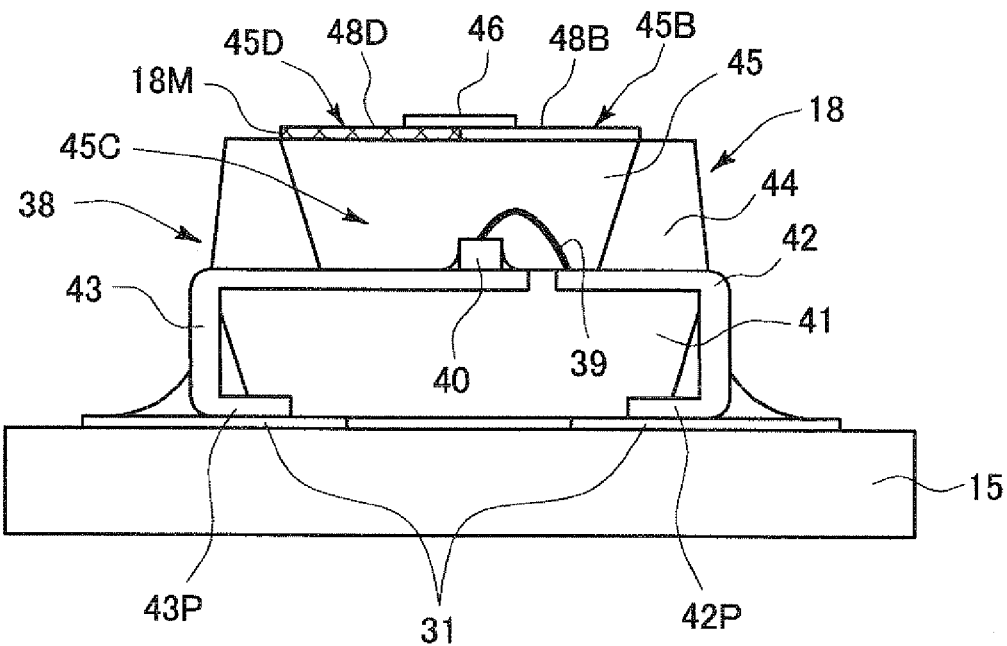
FIG. 6 is a side view showing a light source according to a second modification.
Figure 7:
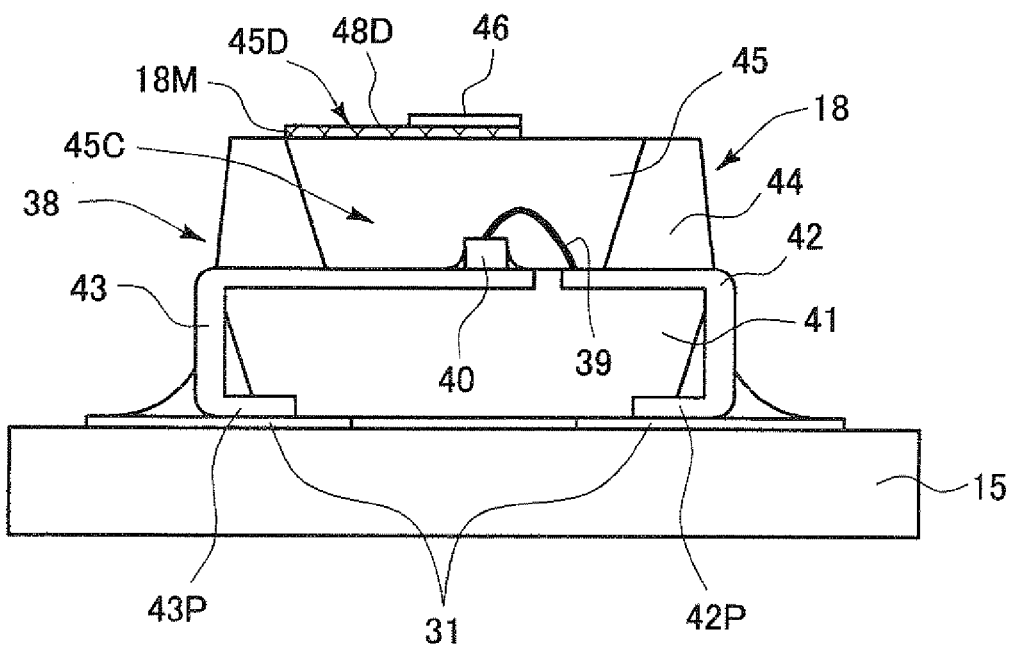
FIG. 7 is a side view showing a light source according to a third modification.

In the light source 18 shown in FIGS. 4A and 4B, the light extinction adjustment layer 48 includes the first portion 48D for covering the first region 45D and the second portion 48B for covering the second region 45B, and the reduction rate of light of the first portion 48D is higher than that of the second portion 48B. Specifically, the first and second portions 48D, 48B are colored with chromatic color or achromatic color. Alternatively, the second portion 48B having a comparatively small reduction rate of light may be not colored so that the second portion 48B is made of a transparent layer, as shown in FIG. 6. Alternatively, the first region 45D may be covered with the first portion 48D, and the second region 45B may not be covered with the light extinction adjustment layer 48, as shown in FIG. 7.

The light extinction adjustment layer 48 may display at least one of a letter, a figure and an ornament pattern, which is projected on the front wall 5F of the push-button type operation part 5U, 5L, such that a printed color tone, a concentration and/or a combination of the color tone and the concentration in the light extinction adjustment layer 48 provide the one of the letter, the figure and the ornament pattern. When the one of the letter, the figure and the ornament pattern formed on the light extinction adjustment layer 48 may be prepared by a colored region made of achromatic color when the illumination color on the front wall 5F that is visible by the operator is basically determined by the color of the front wall 5F itself. In this case, only the amount of illumination light is adjusted in accordance with a print concentration, i,e., brightness.

When the illumination color on the front wall 5F is determined by the color of emitting light of the light source 18 through the light extinction adjustment layer 48, or when the illumination color on the front wall 5F is determined by a combination of the color of emitting light and the color of the front wall 5F itself, the one of the letter, the figure and the ornament pattern formed on the light extinction adjustment layer 48 may be prepared by a colored region made of chromatic color. In this case, when the light source 18 is a white light source, the light extinction adjustment layer 48 functions as a color tone converting layer for converting the incident light emitted from the white light source 18 to a transmitted light having a certain color tone, which is defined by pigment or dye in the layer 48.

Figure 8A:
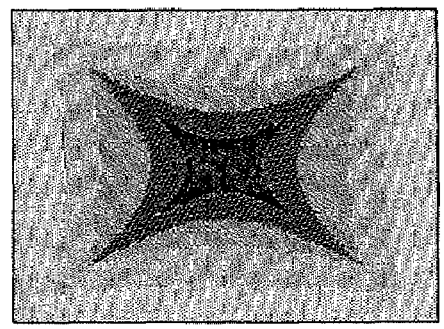
FIG. 8A is a plan view showing a light reduction adjustment layer according to a fourth modification.
Figure 8B:
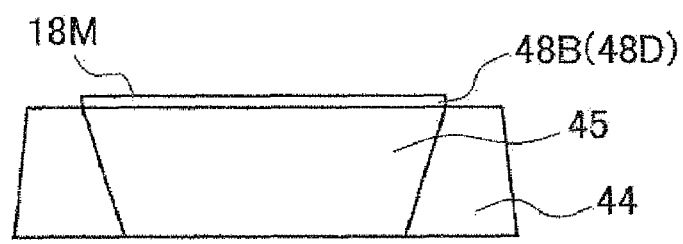
FIG. 8B is a side view showing a light source.
Figure 8C:
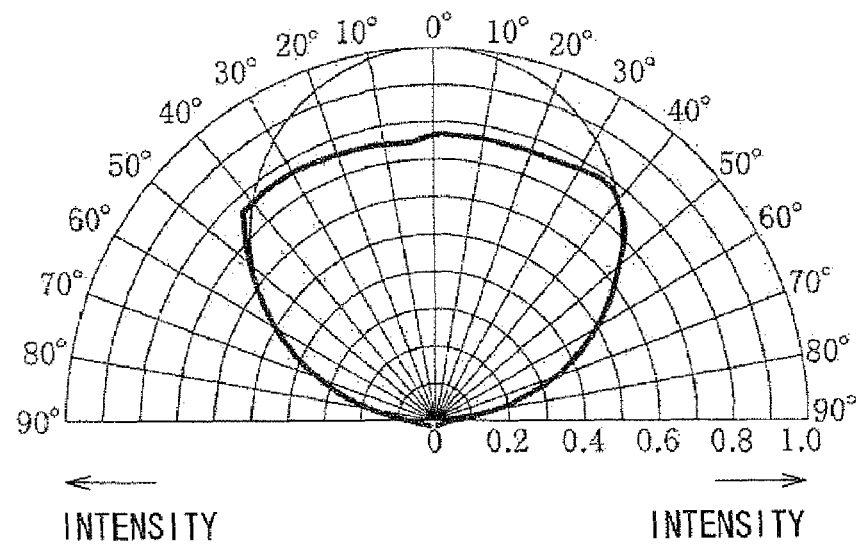
FIG. 8C is a graph showing a distribution of emission intensity.
Figure 9A:
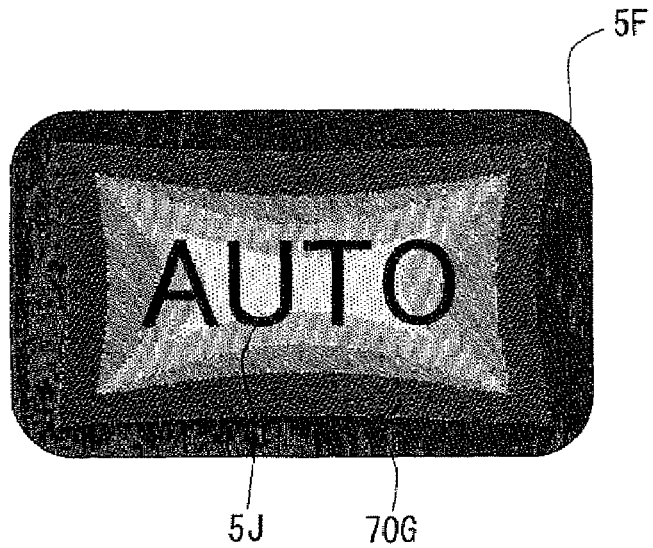
FIG. 9A is a plan view showing a front surface of an operation part.
Figure 9B:
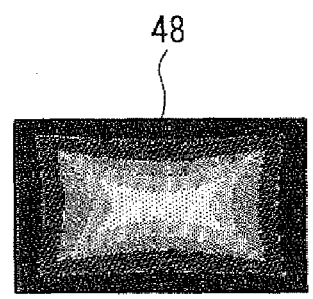
FIG. 9B is a plan view showing a light reduction adjustment layer, according to a fifth embodiment.

FIG. 8A show a gradation pattern printed on the light extinction adjustment layer 48 such that a color tone concentration on the light extinction adjustment layer 48 is changed. The gradation is made of a printed pattern. FIG. 8B shows a cross section of the light source 18, and FIG. 8C shows an illumination light intensity distribution on a light illumination plane. Thus, the front wall 5F of the push-button type operation part 5U, 5L shows a projection transmission pattern 70G shown in FIG. 9A, which corresponds to the print pattern on the light extinction adjustment layer 48 in FIG. 9B. Here, the front wall 5F itself may have a figure or a letter such as "AUTO" in FIG. 9A. In this case, a light shield pattern 5J may be formed by a print method on the front wall 5F Alternatively, the figure or the letter may be prepared by a light transmission region, and the background other than the figure or the letter may be prepared by a light shield region. Thus, the light source 18 turns on so that the source emits the light, and then, the light shield pattern 5J and the projection transmission pattern 70G are combined and viewed by the operator.

Figure 10A:
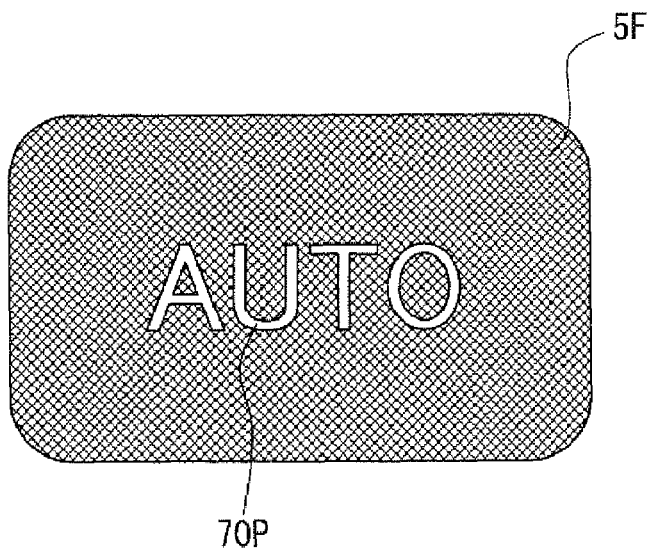
FIG. 10A is a plan view showing a front surface of an operation part.
Figure 10B:
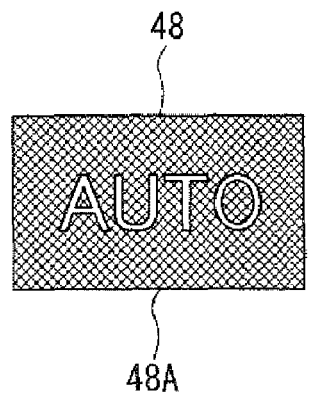
FIG. 10B is a plan view showing a light reduction adjustment layer, according to a sixth embodiment.

FIG. 10B shows a letter pattern "AUTO" 48A, which is printed on the light extinction adjustment layer 48. Here, the letter pattern is prepared by a light transparent region, and a periphery region other than the letter pattern is prepared by a solid black region. A check region represents the solid black region. Alternatively, a figure may be printed on the extinction adjustment layer 48. In this case, the letter pattern is prepared by the solid black region, and the periphery region is prepared by the light transparent region. The front wall 5F shows a projection pattern 70P, as shown in FIG. 10A. Here, a check region represents a solid black region. The periphery region around the letter pattern 48A is a printed region having a high light reduction rate, higher than that of the letter pattern 48A. Thus, the projection pattern 70P is visible by means of the contrast of projection light amount between the letter pattern 48A and the periphery region. Alternatively, the arrangement of the letter pattern 48A and the periphery region around the letter pattern 48A may be opposite, so that the light reduction rate of the periphery region is lower than that of the letter pattern 48A. The periphery region around the letter pattern 48A may be formed from a light shield print region The first and second parts 48D, 48B of the light extinction adjustment layer 48 for covering the first and second regions 45B, 45D, which correspond to the lower and upper push-button type operation parts 5U, 5L, may be formed of color tone converting layers having different illumination color tones. Thus, by using only one light source 18, the light transmission part 5F of the upper push-button type operation part 5U and the light transmission part 5F of the lower push-button type operation part 5L function as light transmission illumination parts having different color tones, respectively.

Figure 11:
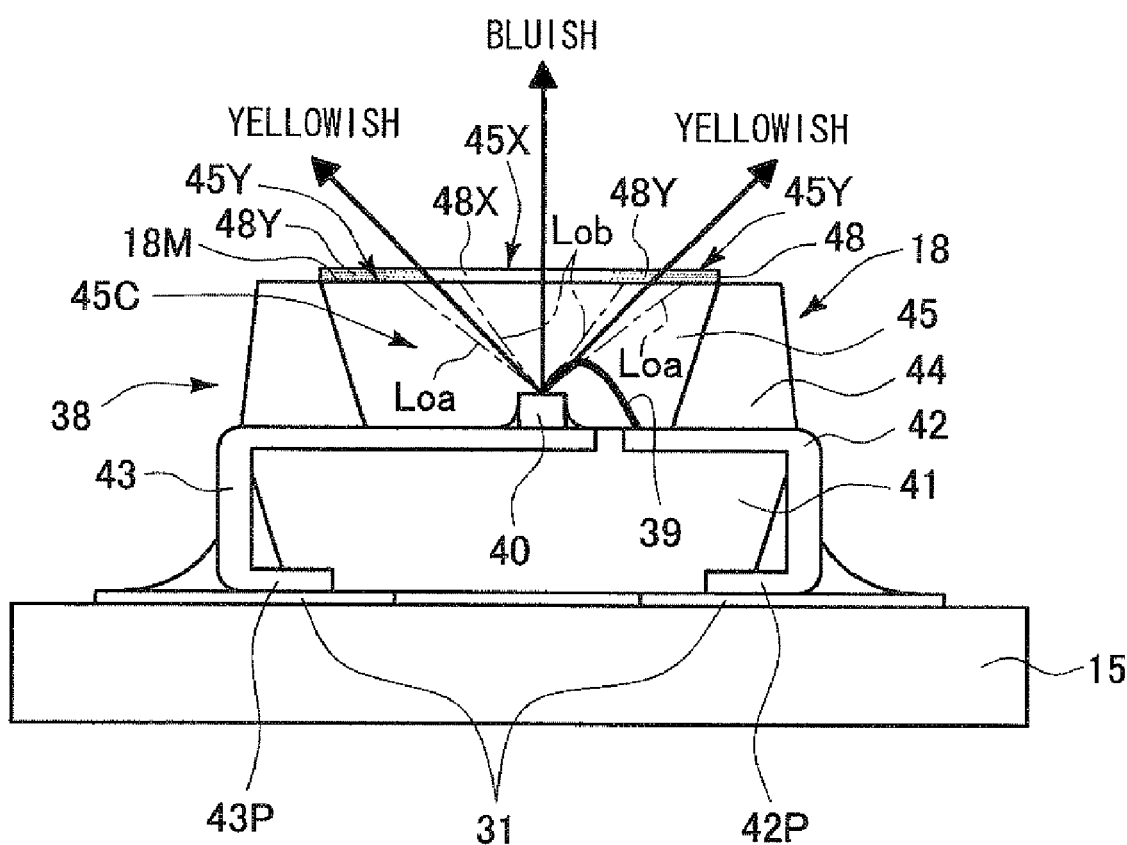
FIG. 11 is a side view showing a light source according to a seventh modification.

As shown in FIG. 11, the resin mold 45 for the light source 18 may be made of transparent base resin including a light excitation particle, which is dispersed in the base resin so that an emission light beam from the light emitting element 40 is converted to an excitation light having a wavelength corresponding to a complementary color of the color tone of the emission light beam. In this case, the light source 18 provides a white light source for illuminating the white light by mixing the direct transmission light from the light emitting element 40 through the base resin and the excitation light by the light excitation particle in a complementary manner. For example, when the light source 18 is a blue light emitting diode made of, for example, GaN, and the light excitation particle is, for example, yellow fluorescence powder made of YAG:Ce (i.e., Yttrium-Aluminum-Garnet with Cerium additive), the direct transmission light is blue light, and the excitation light is yellow light. Thus, the blue and yellow lights are complementary mixed each other, so that the white light is emitted.

However, the light emitting diode emits the emission light beam in the resin mold 45 with various angles. Thus, a transmission length of the resin mold 45 depends on an emission direction. When the transmission length in the resin mold 45 is large, a ratio of conversion to the excitation light by capturing the emission light beam with the light excitation particle becomes high. When the transmission length in the resin mold 45 is small, a ratio of illumination of the direct transmission light without converting the excitation light becomes high. An optimum transmission length for optimizing a complementary mixing ratio between the excitation light and the direct transmission light in order to emit the white light exists. When the actual transmission length is smaller than the optimum transmission length, the visibility strength of the direct transmission light is large, and thereby, the light does not become the white light. On the other hand, when the actual transmission length is larger than the optimum transmission length, the visibility strength of the excitation light is large, and thereby, the light does not become the white light. Thus, in both cases, the light is colored to be the excitation light or the direct transmission light.

As shown in FIG. 11, the above effect is large when the light emitting surface 18M of the resin mold 45 is flat. For example, near the top of the light emitting surface 18M of the light emitting diode chip, i.e., the light emitting element 40, the transmission length of the emission light beam is short, so that the bluish white light is obtained. Here, the color tone of the direct transmission light is blue. Near the periphery of the light emitting surface 18M of the light emitting diode chip, the transmission length of the emission light beam is long, so that the yellowish white light is obtained. Here, the color tone of the excitation light is yellow. Thus, the illumination light has color shading in accordance with the light emitting direction with respect to the light emitting surface IBM.

The light extinction adjustment layer 48 formed on the light emitting surface 18M of the resin mold 45 includes a first portion 48X and a second portion 48Y The first portion 48X covers a first region 45X, and the second portion 48Y covers a second region 45Y. The color tone of each of the first and second portions 48X, 48Y is determined as follows. The light transmission length in the resin mold 45 is larger than a predetermined upper limit length L0a in a case where the light emits from the second region 45Y. In the second region 45Y, the reduction rate of the excitation light is large. Here, the predetermined upper limit length L0a is set to be equal to or greater than the optimum transmission length. The light transmission length in the resin mold 45 is smaller than a predetermined lower limit length L0b in a case where the light emits from the first region 45X. In the first region 45X, the reduction rate of the direct transmission light is large. Here, the predetermined lower limit length L0b is set to be equal to or smaller than the optimum transmission length. In this case, the color tone of the light extinction adjustment layer 48 can be controlled in each of the upper region 45B and the lower region 45D. Accordingly, the complementary mixing rate between the direct transmission light and the excitation light, which is varied in accordance with the transmission length in the resin mold 45, can be uniformed over the whole light emitting surface 18M. Thus, the white light having small color shading is obtained.

In the first region 45X where the light transmission length is smaller than the lower limit length L0b, a component of the light having a wavelength corresponding to the blue light attributed to the direct transmission light is excess, so that the first portion 48X in the light extinction adjustment layer 48 is made of a yellow colored region having a large absorption coefficient with reference to the blue light. In the second region 45Y where the light transmission length is larger than the upper limit length L0a, a component of the light having a wavelength corresponding to the yellow light attributed to the excitation light is excess, so that the second portion 48Y in the light extinction adjustment layer 48 is made of a blue colored region having a large absorption coefficient with reference to the yellow light. In a part of each upper and lower region 45B, 45D, the transmission length is disposed between the upper limit length L0a and the lower limit length L0b. In the part of each upper and lower region 45B, 45D, no light extinction adjustment layer 48 is formed, or the light extinction adjustment layer 48 is formed by the achromatic color light transmission layer so that the color tone is not changed.

Since the light transmission length is continuously changed in accordance with the light emitting direction from the light emitting diode chip 40, the complementary mixing rate between the direct transmission light and the excitation light is continuously changed along with the light emitting surface 18M. Thus, the second portion 48Y (i.e., the outer periphery portion) of the light extinction adjustment layer 48 may be made of a gradation region so that the yellow color concentration is reduced as it goes from the outer periphery of the light emitting surface 18M toward a boundary corresponding to the optimum transmission length. The first portion 48X (i.e., the center portion) of the light extinction adjustment layer 48 may be made of a gradation region so that the blue color concentration is reduced as it goes from the center of the light emitting surface 18M toward the boundary corresponding to the optimum transmission length. Here, the center of the light emitting surface 18M is disposed just above the light emitting element 40. In this case, the color shading is much improved.

Figure 12A:
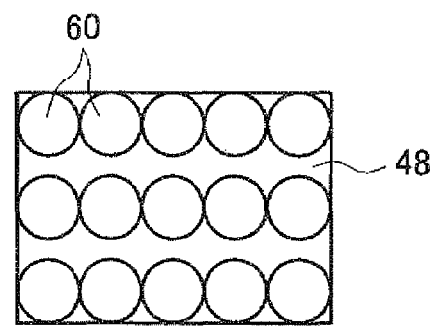
FIG. 12A is a plan view showing a light reduction adjustment layer according to a eighth modification.
Figure 12B:
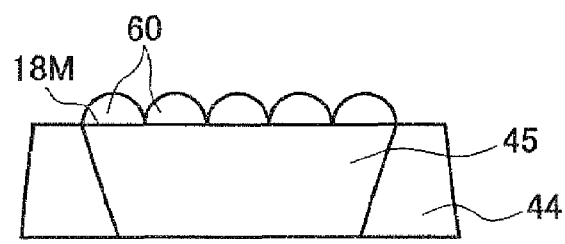
FIG. 12B is a side view showing a light source.
Figure 12C:
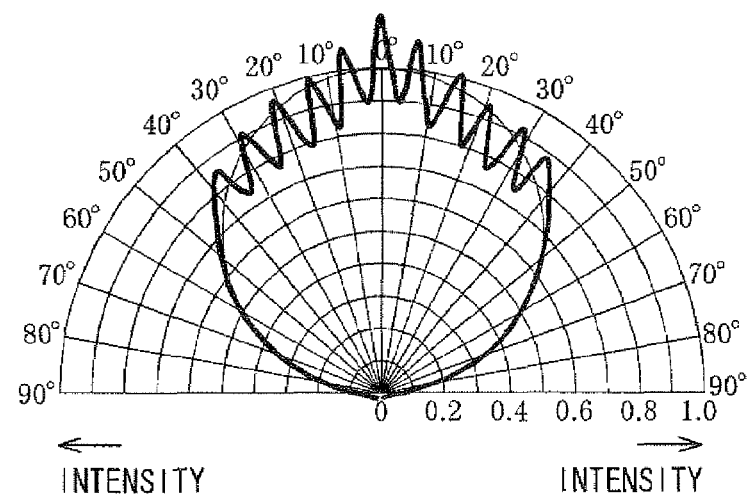
FIG. 12C is a graph showing a distribution of emission intensity.

Alternatively, as shown in FIGS. 12A to 12C, the light extinction adjustment layer 48 may be made of a lens layer 60, which is made of light transparent resin. In this case, the lens layer 60 includes multiple small lenses, each of which has a semi-spherical shape. The small lenses are arranged and dispersed on the whole light emitting surface 18M. In FIG. 12C, the light illumination intensity has a directional characteristics, which is changed periodically according to the arrangement of the small lenses.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. An operation panel comprising:
   a casing having a front surface;
   first and second operation elements disposed on the front surface of the casing;
   a light source for emitting light to each of the first and second operation elements and disposed in the casing; and
   a brightness adjustment layer for covering at least a part of a light emitting surface of the light source, wherein
   the first operation element includes a first light transmission part, and the second operation element includes a second light transmission part,
   the light from the light source transmits the first and second light transmission parts so that the light is output from the casing, and
   the brightness adjustment layer adjusts brightness of the light emitted from the light source and outputting toward one of the first and second light transmission parts, wherein
   the part of the light emitting surface corresponds to the first light transmission part, and another part of the light emitting surface corresponds to the second light transmission part,
   a first distance between the part of the light emitting surface and the first light transmission part is smaller than a second distance between the another part of the light emitting surface and the second light transmission part, and
   the brightness adjustment layer is arranged such that a light reduction rate of the light emitted from the part of the light emitting surface is larger than a light reduction rate of the light emitted from the another part of the light emitting surface.

2. The operation panel according to claim 1, wherein
   the brightness adjustment layer includes a first layer having a first light reduction rate and a second layer having a second light reduction rate,
   the first layer covers a first part of the light emitting surface, which corresponds to the first light transmission part, and the second layer covers a second part of the light emitting surface, which corresponds to the second transmission part, and
   the first light reduction rate is larger than the second light reduction rate.

3. The operation panel according to claim 1, wherein
the another part of the light emitting surface of the light source is not covered with the brightness adjustment layer.

4. The operation panel according to claim 1, wherein
the brightness adjustment layer is made of a resin layer including additive,
the additive is one of pigment and a dye component, and
the additive has one of light blocking property and light absorption property.

5. The operation panel according to claim 4, wherein
the resin layer is a printed resin layer, and
the brightness adjustment layer has a light reduction rate, which is adjustable by a print concentration of the printed resin layer.

6. The operation panel according to claim 1, wherein
the light source is a light emitting module, which includes a light emitting element and a resin mold,
the light emitting element is sealed with the resin mold,
the resin mold has light transparent property, and
the light emitting surface of the light source is provided by a surface of the resin mold.

7. The operation panel according to claim 6, wherein
the light emitting module further includes a module casing,
the module casing has a concavity,
the light emitting element is disposed on a bottom of the concavity,
the resin mold fills the concavity of the module casing,
the surface of the resin mold corresponds to an opening side of the concavity, and
the surface of the resin mold is flat.

8. The operation panel according to claim 6, wherein
the resin mold is made of transparent resin base material with a plurality of light excitation particles,
the plurality of light excitation particles is dispersed in the transparent resin base material,
each light excitation particle converts a light beam emitted from the light emitting element to an excitation light,
the excitation light has a light wavelength corresponding to a complementary color of a color tone of the light beam,
the light source emits a white light, which is provided by complementary mixing the excitation light and a direct transmitted light,
the direct transmitted light transmits through the transparent resin base material in the resin mold,
the brightness adjustment layer has a first portion and a second portion,
the first portion covers a first part of the light emitting surface, and the second portion covers a second part of the light emitting surface,
in the first part, a light transmitting length in the resin mold is larger than a predetermined upper limit length,
in the second part, a light transmitting length in the resin mold is smaller than a predetermined lower limit length,
the first portion has a first color tone in such a manner that a light reduction rate with respect to the excitation light is larger than a light reduction rate with respect to the direct transmitted light, and
the second portion has a second color tone in such a manner that the light reduction rate with respect to the direct transmitted light is larger than the light reduction rate with respect to the excitation light.

9. The operation panel according to claim 1, wherein
the first operation element has a first push button operation surface, and the second operation element has a second push button operation surface,
the first and second push button operation surfaces are adjacent to each other along with the front surface of the casing,
the light source is disposed on a backside inner surface of the casing,
the backside inner surface faces the front surface,
the light source is arranged at a boundary between the first and second operation elements,
the first push button operation surface contacts the second push button operation surface at the boundary,
each of the first and second push button operation surfaces is slant with respect to a direction perpendicular to the boundary,
the brightness adjustment layer includes a first layer having a first light reduction rate and a second layer having a second light reduction rate,
the first layer covers a first part of the light emitting surface, which corresponds to the first push button operation surface, and the second layer covers a second part of the light emitting surface, which corresponds to the second push button operation surface,
the first push button operation surface is disposed near the light emitting surface, and the second push button operation surface is far from the light emitting surface, and
the first light reduction rate is larger than the second light reduction rate.

10. The operation panel according to claim 9, wherein
the light source further includes a light shield layer, which is arranged at the boundary.

11. The operation panel according to claim 1, wherein
the brightness adjustment layer is made of a plurality of lenses, each of which concentrates the light emitted from the light source.

12. An operation panel comprising:
a casing having a front surface;
first and second operation elements disposed on the front surface of the casing;
a light source for emitting light to each of the first and second operation elements and disposed in the casing; and
a brightness adjustment layer for covering at least a part of a light emitting surface of the light source, wherein
the first operation element includes a first light transmission part, and the second operation element includes a second light transmission part,
the light from the light source transmits the first and second light transmission parts so that the light is output from the casing, and
the brightness adjustment layer adjusts brightness of the light emitted from the light source and outputting toward one of the first and second light transmission parts, wherein
the brightness adjustment layer is made of a resin layer including additive,
the additive is one of pigment and a dye component, and
the additive has one of light blocking property and light absorption property.

13. The operation panel according to claim 12, wherein
the resin layer is a printed resin layer, and
the brightness adjustment layer has a light reduction rate, which is adjustable by a print concentration of the printed resin layer.

* * * * *